(12) United States Patent
Ahopelto

(10) Patent No.: US 9,697,957 B2
(45) Date of Patent: Jul. 4, 2017

(54) ELECTROCHEMICAL CAPACITOR AND SEMICONDUCTOR CHIP HAVING AN ELECTROCHEMICAL CAPACITOR

(71) Applicant: Teknologian tutkimuskeskus VTT, VTT (FI)

(72) Inventor: Jouni Ahopelto, Helsinki (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 0 days.

(21) Appl. No.: 14/381,608

(22) PCT Filed: Feb. 28, 2013

(86) PCT No.: PCT/FI2013/050226
§ 371 (c)(1),
(2) Date: Aug. 28, 2014

(87) PCT Pub. No.: WO2013/128082
PCT Pub. Date: Sep. 6, 2013

(65) Prior Publication Data
US 2015/0332863 A1 Nov. 19, 2015

(30) Foreign Application Priority Data
Feb. 28, 2012 (FI) .................................. 20125219

(51) Int. Cl.
*H01G 11/26* (2013.01)
*H01G 11/00* (2013.01)
(Continued)

(52) U.S. Cl.
CPC ............. *H01G 11/26* (2013.01); *H01G 11/28* (2013.01); *H01G 11/30* (2013.01); *H01G 11/54* (2013.01);
(Continued)

(58) Field of Classification Search
CPC ........ H01G 11/26; H01G 11/28; H01G 11/30; Y02E 60/13
See application file for complete search history.

(56) References Cited

U.S. PATENT DOCUMENTS

2002/0154467 A1* 10/2002 Nakazawa ............. H01G 9/155
361/302
2003/0039604 A1   2/2003 Niu
(Continued)

FOREIGN PATENT DOCUMENTS

EP         2104164 A1    9/2009
WO    WO 2011123135 A1  10/2011

OTHER PUBLICATIONS

Chmiola et al., "Anomalous Increase in Carbon Capacitance at Pore Sizes Less Than 1 Nanometer", Science, Sep. 22, 2006, vol. 313, pp. 1760-1763.
(Continued)

*Primary Examiner* — John C Ingham
*Assistant Examiner* — Ismail Muse
(74) *Attorney, Agent, or Firm* — Seppo Laine Oy

(57) ABSTRACT

An integrable electrochemical capacitor and methods for manufacturing the same are disclosed. The electrochemical capacitor comprises a first electrode comprising a first rigid piece having a first porous portion, a second electrode comprising a second rigid piece having a second porous portion, and an electrolyte in contact with the first porous portion and the second porous portion. The structure allows the electrochemical capacitor to be manufactured without a separator film between the electrodes and is compatible with semiconductor manufacturing technologies. The electrochemical capacitor can also be manufactured within a SOI layer 8.

19 Claims, 6 Drawing Sheets

(51) Int. Cl.

| | | |
|---|---|---|
| H01L 27/12 | (2006.01) | |
| H01G 11/54 | (2013.01) | |
| H01G 11/86 | (2013.01) | |
| H01G 11/28 | (2013.01) | |
| H01G 11/30 | (2013.01) | |
| H01L 27/13 | (2006.01) | |
| H01L 49/02 | (2006.01) | |

(52) U.S. Cl.
CPC ......... *H01G 11/86* (2013.01); *H01L 27/1203* (2013.01); *H01L 27/13* (2013.01); *H01L 28/60* (2013.01); *H01L 28/84* (2013.01); *Y02E 60/13* (2013.01)

(56) References Cited

U.S. PATENT DOCUMENTS

| | | |
|---|---|---|
| 2006/0098389 A1 | 5/2006 | Liu et al. |
| 2006/0141793 A1 | 6/2006 | Anceau |
| 2008/0064178 A1 | 3/2008 | Ho et al. |
| 2008/0268299 A1* | 10/2008 | Eickhoff ............ H01G 9/28 429/431 |
| 2010/0221606 A1 | 9/2010 | Nalamasu et al. |
| 2011/0051322 A1 | 3/2011 | Pushparaj et al. |
| 2011/0075324 A1* | 3/2011 | Singh ............... H01G 11/56 361/503 |
| 2011/0163273 A1 | 7/2011 | Baca et al. |
| 2011/0199716 A1* | 8/2011 | Feaver ............... H01G 11/34 361/502 |
| 2015/0049414 A1* | 2/2015 | Gardner ............. H01G 11/26 361/502 |

OTHER PUBLICATIONS

Desplobain et al., "Investigations on porous silicon as electrode material in electrmechanical capacitors", Wiley-VCH, 2007, Phys. Stat. Sol. (c) 4, No. 6, pp. 2180-2184.

Rowlands et al. "Supercapacitor Devices Using Porous Silicon Electrodes", Ionics 5, 1999, pp. 144-149.

* cited by examiner ately large to be integrated on a chip. Known solutions to reach greater specific energies are provided by batteries, fuel cells and supercapacitors, i.e. electrochemical capacitors. Such solutions are described in EP 2104164 A1 and US 2010/0221606 A1 and US 2011/0051322 A1. However, these structures are difficult to integrate firstly because manufacturing processes are not compliant to microelectronics manufacturing processes and secondly because the structures themselves are difficult to accommodate on a semiconductor chip. Thus, the batteries and electrochemical capacitors are practically applicable only as discrete components and therefore require arrangements for contacts with the on-chip applications.

ELECTROCHEMICAL CAPACITOR AND SEMICONDUCTOR CHIP HAVING AN ELECTROCHEMICAL CAPACITOR

TECHNICAL FIELD

The present invention relates to energy storage devices and methods for their manufacture.

The present invention relates in particular to small energy storage devices suitable for use with on-chip applications and energy harvesters.

BACKGROUND ART

US 2006/0141793 A1 discloses a capacitor formed in a trench within a silicon-on-insulator layer. The capacitor is formed between two polysilicon layers separated by an insulating layer.

US 2008/0064178 A1 discloses a capacitor formed in a deep trench in a silicon substrate. The capacitor in made through a silicon-on-insulator layer on top of the silicon substrate. The capacitor is formed between a doped silicon substrate and a second electrode that is made in the trench, separated from the substrate by a dielectric layer.

The above techniques are basically integrable but their capability to store energy leaves room for improvement. Therefore, the attempts to use them as energy storage device may still lead to structures that are impractically large to be integrated on a chip. Known solutions to reach greater specific energies are provided by batteries, fuel cells and supercapacitors, i.e. electrochemical capacitors. Such solutions are described in EP 2104164 A1 and US 2010/0221606 A1 and US 2011/0051322 A1. However, these structures are difficult to integrate firstly because manufacturing processes are not compliant to microelectronics manufacturing processes and secondly because the structures themselves are difficult to accommodate on a semiconductor chip. Thus, the batteries and electrochemical capacitors are practically applicable only as discrete components and therefore require arrangements for contacts with the on-chip applications.

WO 2011/123135 A1 discloses a charge storage device includes first and second electrically conductive structures separated from each other by a separator. At least one of the first and second electrically conductive structures includes a porous structure containing multiple channels. Each one of the channels has an opening to a surface of the porous structure. In another embodiment the charge storage device includes multiple nanostructures and an electrolyte in physical contact with at least some of the nanostructures. Thus, there remains need to seek further improvements in energy storage devices to make them more suitable for use with on-chip applications and energy harvesters.

DISCLOSURE OF INVENTION

It is an object of the present invention to create new capacitor structures and methods for their manufacture.

According to an aspect of the invention, there is provided an electrochemical capacitor, comprising a first electrode comprising a first rigid piece having a first porous portion 11, a second electrode 2 comprising a second rigid piece having a second porous portion 12, and an electrolyte 5 in contact with the first porous portion 11 and the second porous portion 12.

According to another aspect of the invention, such an electrochemical capacitor is provided on a semiconductor chip and electrically connected to at least one semiconductor device.

According to an aspect of the invention, there is provided a method of manufacturing the electrochemical capacitor recited above.

According to an aspect of the invention, the method comprises providing the first electrode, providing the second electrode, providing a rigid support structure such that the first rigid piece, the second rigid piece and the rigid support structure form a cavity partially delimited by the first porous portion and the second porous portion, and filling the cavity with the electrolyte.

According to another aspect of the invention, the method comprises providing a first portion of a rigid support structure, providing the first electrode on the first portion of the rigid support structure, providing the second electrode on the first portion of the rigid support structure spaced apart from said first electrode, providing a second portion of the rigid support structure such that the first rigid piece, the second rigid piece and the rigid support structure form a cavity partially delimited by the first porous portion and the second porous portion, and filling the cavity with the electrolyte.

The present invention has embodiments that can provide small energy storage devices suitable for use with on-chip applications and energy harvesters.

The present invention also has embodiments that allow the electrochemical capacitor to be manufactured without a separator film between the electrodes.

The present invention also has embodiments that are compatible with semiconductor manufacturing technologies.

The present invention also has embodiments wherein the electrochemical capacitor can be manufactured within a SW layer.

Therefore, the embodiments of the present invention provide considerable benefits.

Some of the possible embodiments are described more particularly below.

MODES FOR CARRYING OUT THE INVENTION

Figure 1:
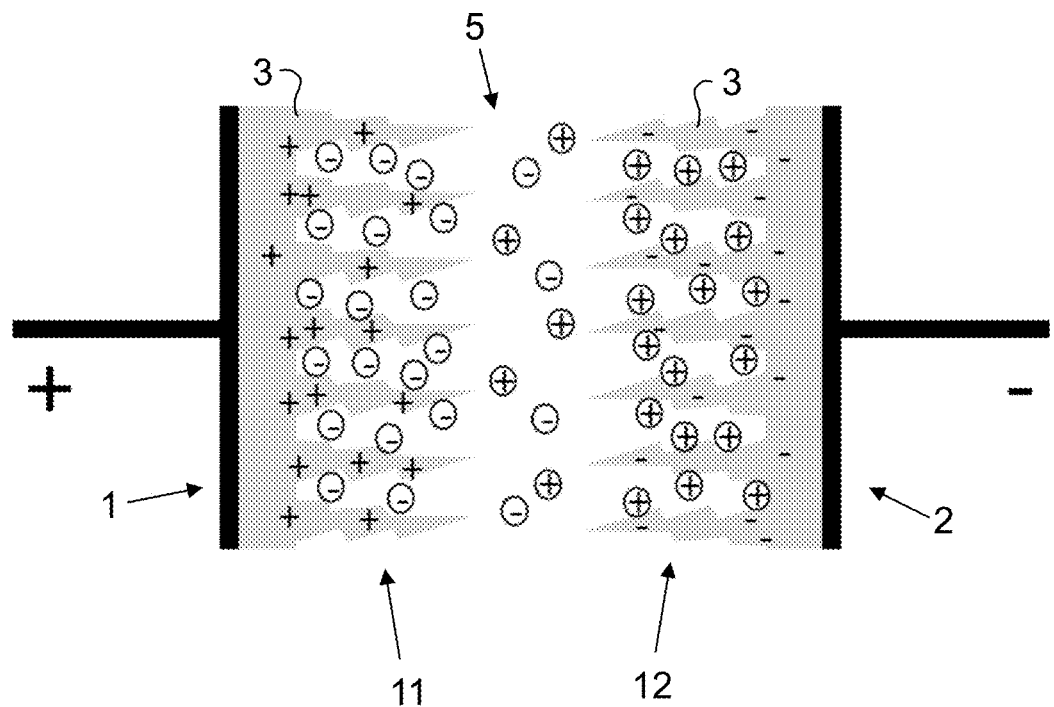
FIG. 1 shows a basic structure of an electrochemical capacitor according to an embodiment.

FIG. 1 shows a basic structure of an electrochemical capacitor according to an embodiment. The electrochemical capacitor of FIG. 1 comprises a first electrode 1 and a second electrode 2 formed in a semiconductor material 3. The first electrode 1 comprises a first porous portion 11 and the second electrode 2 comprises a second porous portion 12. The first porous portion 11 and the second porous portion 12 are typically in opposing relationship to each other. The first porous portion 11 and the second porous portion 12 are not in direct contact with each other but there remains a space between the surfaces 11, 12, which space is called as trench in this document. Thus, also the electrochemical capacitor of FIG. 1 comprises a trench 4 defined between the first porous portion 11 and the second porous portion 12. The electrochemical capacitor of FIG. 1 also comprises an electrolyte 5 in the trench 4.

Figure 2:
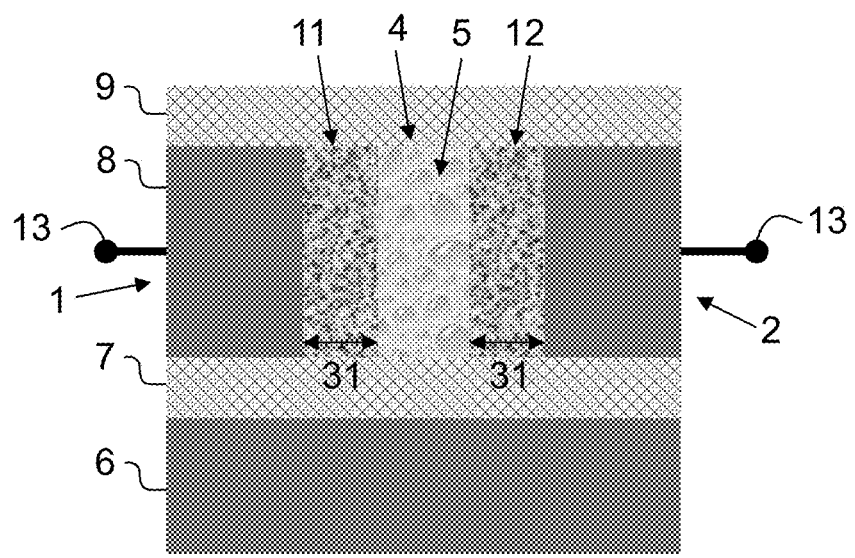
FIG. 2 shows another embodiment wherein an electrochemical capacitor is made in a silicon-on-insulator (SOI) layer.

FIG. 2 shows another embodiment wherein the electrochemical capacitor, such as the capacitor of FIG. 1, is made in a silicon-on-insulator (SOI) layer on a SOI wafer that comprises a wafer substrate 6, an insulator layer 7 on the wafer substrate 6 and the silicon-on-insulator layer 8 on top of the structure. During manufacturing process, the SOI wafer is processed to form the electrochemical capacitor of FIG. 2 and possibly other devices, such as electrical and/or electromechanical devices, as well.

FIG. 2 shows the first electrode 1 and the second electrode 2 formed in the silicon-on-insulator layer 8. FIG. 2 also shows that the silicon-on-insulator layer 8 is divided into at least first and second rigid pieces in which the first porous portion 11 and the second porous portion 12 are made, respectively. FIG. 2 also shows the electrolyte 5 in the trench 4 between the first and second rigid pieces. In addition, there is a second insulator layer 9 on the surface of the silicon-on-insulator layer 8 and covering also the trench 4 in order to retain the electrolyte 5 between the electrodes.

In the embodiments, the thickness of the silicon-on-insulator layer 8 can be for example 1-300 micrometers, such as 1-200 micrometers, or 1-50 micrometers. Examples of possible thicknesses are 1 micrometer and 10 micrometers.

The width of the trench 4 can be for example 1-50 micrometers, such as 1-10 micrometers. Examples of widths include 1 micrometer, 10 micrometers and 30 micrometers.

The thickness of the porous portion 11, 12 can be for example 1-200 micrometers, such as 1-100 micrometers, or 1-10 micrometers. Examples of possible thicknesses include 1 micrometer, 10 micrometers or 100 micrometers.

When referring to FIG. 2, the thickness of the silicon-on-insulator layer 8 corresponds to the distance between the insulator layer 7 and the second insulator layer 9 and the width of the trench 4 corresponds to the distance between the first porous portion 11 and the second porous portion 12. The thickness of the porous portion 11, 12 refers to the depth on the surface layer of the base material that is made porous. Thus, in the FIG. 2, the thickness of the porous portion 11, 12 is measured in the direction of the width of the trench 4.

According to an embodiment, the thickness of the silicon-on-insulator layer 8 is 1-50 micrometers, the width of the trench 4 is 1-20 micrometers and the thickness of the porous portion 11, 12 is 1-30 micrometers.

According to an embodiment, the electrochemical capacitor of FIG. 2 is manufactured as follows:
1. A trench 4 is formed in through the silicon-on-insulator layer 8 such that the bottom of the trench 4 is defined by a portion of the insulator layer 7. The trench can be formed by means of suitable microelectronics manufacturing processes. Such processes are discussed in more detail in the above-cited publications US 2006/0141793 A1 and US 2008/0064178 A1, both of which are incorporated herein by reference.
2. Ends (not shown in FIG. 2) of the trench 4 are closed with an insulating material. These steps can be made by means of any suitable process. Some of the possible processes are discussed in more detail in the above-referred publications US 2006/0141793 A1 and US 2008/0064178 A1.
3. Side surfaces of the trench 4 are treated to make the semiconductor material 3 of the silicon-on-insulator layer 8 porous, such as mesoporous. This step forms the first porous portion 11 for the first electrode 1 and the second porous portion 12 for the second electrode 2. The forming of the pores can be made by any suitable manufacturing process. Some of the possible processes are discussed in more detail in the above-cited publications EP 2104164 A1, US 2010/0221606 A1 and US 2011/0051322 A1, all of which are incorporated herein by reference.
4. The trench 4 is filled with the electrolyte 5. The electrolyte 5 can be any suitable liquid or solid electrolyte. Some of the possible electrolyte materials are discussed in more detail in the above-referred publications EP 2104164 A1, US 2010/0221606 A1 and US 2011/0051322 A1. Examples of the possible electrolytes include organic electrolytes and water with a suitable surfactant. Examples of suitable organic electrolytes include propylene carbonates.
5. The trench 4 filled with the electrolyte 5 is covered by means of the second insulator layer 9. These steps can be made by means of any suitable process. Some of the possible processes are discussed in more detail in the above-referred publications US 2006/0141793 A1 and US 2008/0064178 A1.

In addition, electrical contacts 13 to the electrodes are made in a suitable phase in the process.

In the embodiment of FIG. 2, the channels formed by the pores in the porous portions 11, 12 extend laterally along the silicon-on-insulator layer 8. This means that the channels are co-directional with the arrows 31 shown in FIG. 2. The directionality can be achieved by applying an appropriate voltage to the structure during the etching step. This embodiment is convenient especially when integrating structures on a SOI wafer.

Figure 3:
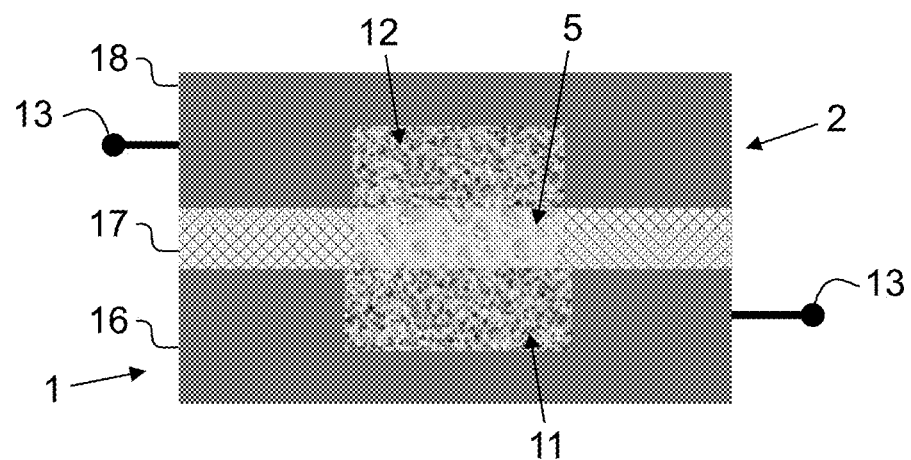
FIG. 3 shows an electrochemical capacitor according to another embodiment.

FIG. 3 shows an electrochemical capacitor according to another embodiment. The electrochemical capacitor of FIG. 3 comprises a first electrode 1 and a second electrode 2 formed in a first substrate 16 and a second substrate 18, respectively. These two different pieces 16, 18 of semiconductor material thus form a first rigid piece and a second rigid piece. The first electrode 1 comprises a first porous portion 11 and the second electrode 2 comprises a second porous portion 12. The first and second rigid pieces are connected to each other by means of an insulator layer 17 between the rigid pieces. The first porous portion 11 and the second porous portion 12 are placed in opposing relationship to each other. One of the applicable methods is so called wafer bonding. In this arrangement there is no actual trench 4 but the first and second electrodes are spaced apart from each other by means of the insulator layer 17. The first and second rigid pieces and the insulator layer 17 delimit a cavity which is filled with the electrolyte 5.

Figure 4:
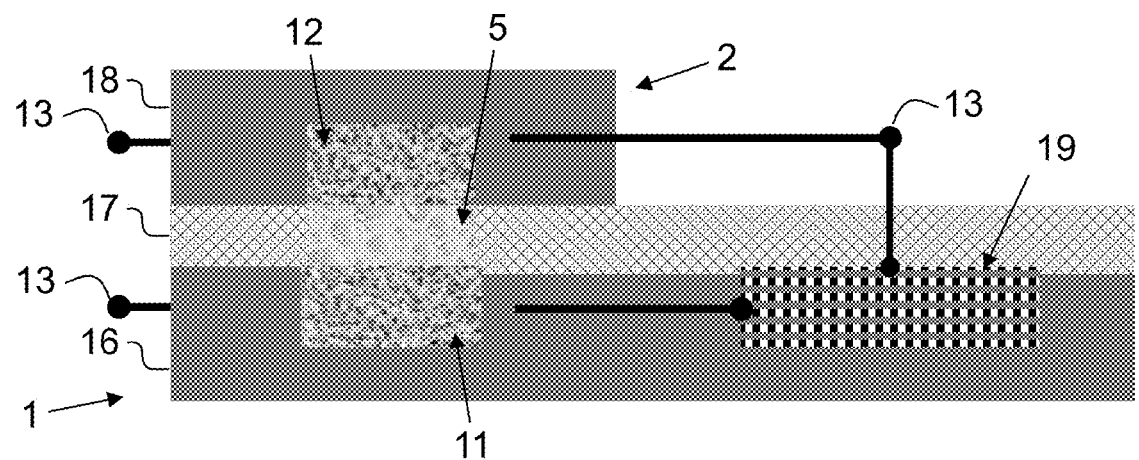
FIG. 4 shows a further embodiment wherein the electrochemical capacitor of FIG. 3 is integrated with other devices.

FIG. 4 shows a further embodiment wherein the electrochemical capacitor of FIG. 3 is manufactured on a first substrate 16 that contains also other devices 19 manufactured on the substrate. FIG. 4 also shows that the electrochemical capacitor is electrically connected to the other devices 19 by means of electrical contacts 13.

The dimensions relating to electrochemical capacitors of FIGS. 3 and 4 can be for example those suggested above after discussion of the embodiments of FIG. 2. Then, the width of the trench 4 corresponds to the thickness of the insulator layer 17, and the thickness of the porous portions 11, 12 is measured in the direction of the thickness of the insulator layer 17. As said, those dimensions are possible but the arrangement of FIGS. 3 and 4 easily allows using significantly greater dimensions, too. The first and second substrates 16, 18 can be thick and thus there are no exact limitations to the thicknesses of the porous portions 11, 12 either. The area of the porous portions 11, 12 along the surfaces of the substrates 16, 18 can also be large. Therefore, these embodiments can be designed to provide also large capacitances, if desired.

In the embodiments with a trench 4, or a plurality of trenches 4, like in the embodiment of FIG. 2, the capacitance of the capacitor can be increased by increasing the length of the trench 4, for instance. Of course, other parameters are also significant, such as the surface area of the material forming the porous portions 11, 12, but for a given process design and selected wafer type, the capacitance of the capacitor can be selected by means of the length of the trench 4. The length can be selected as desired, and can be for example 10 micrometers, 100 micrometers, 1 millimeters or 1 centimeters, just to give some examples of possible lengths.

Another way to increase the capacitance is to connect a plurality of capacitor according to any one of the embodiments in parallel. On the other hand, the voltage provided by the capacitors can be increased by connecting a plurality of capacitors in series. Such parallel and/or series connected capacitors can in integrated on a single wafer, or assembled from a plurality of pieces.

Figure 5:
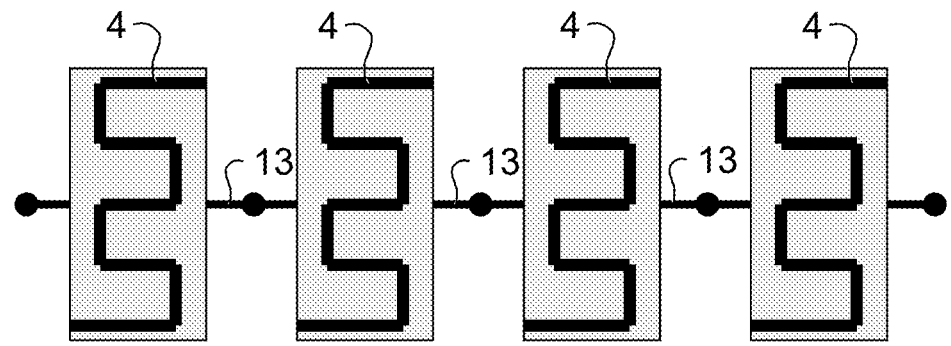
FIG. 5 shows an embodiment wherein four capacitors are connected in series.

FIG. 5 shows an example according to an embodiment wherein four capacitors are connected in series by electrical contacts 13. The capacitors are of the "trench" type represented by the embodiment of FIG. 2, for instance. In the embodiment of FIG. 5, the trenches 4 form a zigzag pattern on the substrate, which helps to accommodate a longer trench in a given space and thus to increase capacitance.

Figure 6:
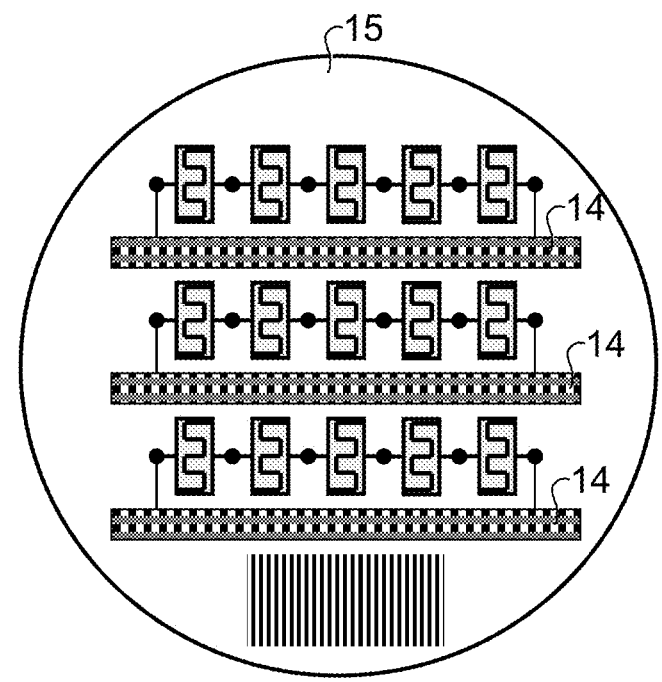
FIG. 6 shows an embodiment wherein series connected electrochemical capacitors are integrated directly with other devices 14 at a wafer level.

FIG. 6 shows an embodiment, wherein series connected electrochemical capacitors, such as those of FIG. 5, are integrated directly with other devices 14 at a wafer level. According to the embodiment, groups of series-connected electrochemical capacitors are manufactured on a wafer 15 and further connected to other devices 14 manufactured on the wafer 15. Such other devices 14 can be MEMS devices, energy harvesters or energy consuming circuits, for instance. Of course, the figure is not in scale and in an actual realization the size of the electrochemical capacitors and the other devices 14 can be significantly smaller in relation to the size of the wafer 15.

Figure 7:
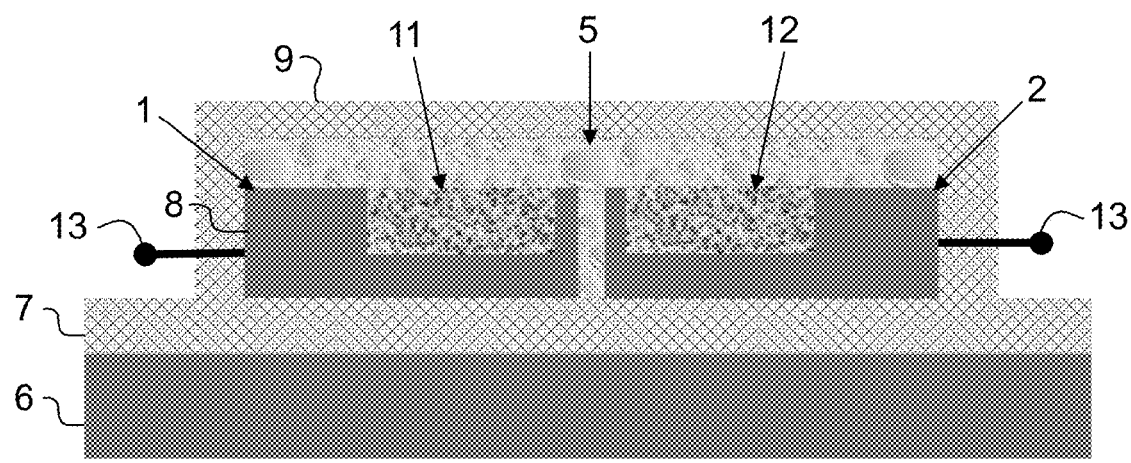
FIG. 7 shows a further embodiment on an electrochemical capacitor.

FIG. 7 shows a further embodiment on an electrochemical capacitor. In this embodiment, the capacitor is made in a silicon-on-insulator (SOI) layer on a SOI wafer that comprises a wafer substrate 6, an insulator layer 7 on the wafer substrate 6 and the silicon-on-insulator layer 8 on top of the structure. The first electrode 1 and the second electrode 2 are formed in the silicon-on-insulator layer 8 such that the first porous portion 11 and the second porous portion 12 are both made from the "upper" surface of the silicon-on-insulator layer 8. Then, the trench 4 left between the first and second rigid pieces, which are portions of the silicon-on-insulator layer 8, can be filled with the electrolyte or an insulating material, because the principal capacitor surfaces are directed "upward" in the structure. In this embodiment, the support structure is formed by the insulator layer 7 on the wafer substrate 6 and a second insulator layer 9 provided over the first electrode 1 and the second electrode 2 and the cavity for the electrolyte 5. Based on the above embodiments alone, it is clear that the invention can be utilized in various different ways and several other embodiments can also be readily contemplated. In general, the embodiments provide different types of electrochemical capacitors such that the electrochemical capacitor comprises a first electrode 1 comprising a first rigid piece having a first porous portion 11, a second electrode 2 comprising a second rigid piece having a second porous portion 12, and an electrolyte 5 that is in contact with the first porous portion 11 and the second porous portion 12. The rigidity of the first piece and the second piece provides that the electrodes are not accidentally short-circuited even without a separator film between the electrodes 1, 2. On the other hand, the porosity of the first and second porous portions 11, 12 provides large surface areas for the electrodes 1, 2 and therefore helps in achieving large capacitances in compact structures.

According to another embodiment, the first rigid piece and the second rigid piece are attached to a rigid support structure and spaced apart from each other.

According to a further embodiment, the second rigid piece and the rigid support structure together enclose a cavity for the electrolyte 5. The rigid support structure can be formed by a plurality of separate insulator layers or other insulator formations, such as layers 7 and 9 in FIGS. 2 and 7, or even by a single insulator layer, such as layer 17 in FIGS. 3 and 4.

According to a further embodiment, the cavity is completely filled with the electrolyte 5 and contains no separator film.

According to a further embodiment, the first porous portion 11 comprises a plurality of first pores within a first material, each of the first pores having an interior surface, and the second porous portion 12 comprises a plurality of second pores within a second material, each of the second pores having an interior surface, and the electrolyte 5 is in contact with the interior surfaces of at least some of the first pores and at least some of the second pores. In this embodiment, the first material and the second material can be same material or different materials.

According to a further embodiment, at least one of the first and second materials is a semiconductor material 3.

According to a further embodiment, both the first and second materials are silicon (Si).

According to a further embodiment, the first porous portion 11 comprises at least a third material on the surface of the first material, which third material forms at least a portion of the interior surfaces of the first pores.

According to an embodiment, the third material is comprised of native oxide of silicon.

According to another embodiment, the third material is comprised of native oxide of silicon and at least one metal on the surface of the native oxide.

According to a further embodiment, the third material is comprised of at least one metal directly on the surface of the first material.

According to a further embodiment, the third material is comprised of a conducting oxide or a conducting oxide on the surface of the native oxide.

According to an even further embodiment, the third material is comprised of a conducting nitride or a conducting nitride on the surface of the native oxide.

According to another embodiment, the second porous portion 12 comprises at least a fourth material on the surface of the second material, which fourth material forms at least a portion of the interior surfaces of the second pores. The fourth material can correspond to the third material described above.

According to another embodiment, the electrochemical capacitor comprises a first electrode 1 formed in a semiconductor material 3 and comprising a first porous portion 11 and a second electrode 2 formed in the semiconductor material 3 and comprising a second porous portion 12. These are separated by a trench 4 between the first porous portion 11 and the second porous portion 12, which trench is filled with an electrolyte 5. In this embodiment, both of the electrodes are part of the body of the semiconductor material 3 and not particulate as in many of the conventional electrochemical capacitors. Thus, the electrode material supports itself such that it does not tend to flow and mix with the other electrode.

According to another embodiment, the first electrode 1 and the second electrode 2 are both part of a rigid structure and firmly spaced apart from each other by the rigid structure. Then, there is no danger of short-circuiting between the first and second electrodes as they are firmly separated from each other by a distance filled with the electrode. This structure also has the advantage that no separator film between the first and second electrodes is needed like in the conventional electrochemical capacitors. This can allow designs that are simpler, smaller and/or more economical to manufacture.

There are also embodiments in which the electrodes can be placed significantly closer to each other than in the prior structures that need to have a separator film between the first and second electrodes. Such separator films can have their thicknesses between 10 and 50 micrometers and as these embodiments can alleviate the need of the separator film, the distance between the electrodes can be shorter. For example, the shortest distance from the surface of the first electrode to the surface of the second electrode can be as low as 10 micrometers, for instance. According to an embodiment, the said shortest distance is less than 10 micrometers, such as less than 5 micrometers. According to a further embodiment, said shortest distance is less than 2 micrometers, such as less than 1 micrometer.

According to an embodiment, the semiconductor material 3 is silicon (Si). According to another embodiment, the semiconductor material 3 is gallium arsenide (GaAs). According to a further embodiment, the semiconductor material 3 is gallium phosphide (GaP). According to a further embodiment, the semiconductor material 3 is germanium (Ge). According to an even further embodiment, the semiconductor material 3 is silicon-germanium (SiGe). All these materials can be made porous by means of the above-referred processes and their variations.

Of course, it is also possible to use other 3-5 or 2-6 compounds or other semiconducting materials that can be made porous. Furthermore, the embodiments are not limited to semiconducting materials alone but it is also possible to use other rigid materials that can be made suitably porous. Such other materials include metals, for instance.

According to another embodiment, the semiconductor material 3 is p-type silicon.

According to another embodiment, the semiconductor material 3 is n-type silicon.

According to a further embodiment, the semiconductor material 3 is highly doped p-type silicon or highly doped n-type silicon. Other embodiments comprise the use of medium doped n-type silicon and medium doped p-type silicon.

According to an embodiment, the semiconductor material 3 has resistivity less than 100 mΩ-cm, such as less than 10 mΩ-cm. In embodiments aiming at particularly low internal resistance, the semiconductor material 3 can have a resistivity even less than 1 mΩ-cm.

The resistivity of the porous material can be further decreased by gas phase doping after the formation of the porous material. This additional doping can be made, for example, in a furnace in a gaseous ambient containing p-type or n-type dopants, $B_2H_6$, $BCl_3$ or $PH_3$, for instance. The additional doping can also be made by diffusion from a solid source deposited on or within the porous material.

According to an embodiment, at least portions of the first and second porous portions 11, 12 are mesoporous, macroporous or microporous. A mesoporous material is a material containing pores with widths or diameters mainly between 2 and 50 nm. Of course, there can be some pores that are smaller or greater but generally the porous part of the surface is mesoporous in this embodiment. A microporous material has pores with widths or diameters mainly less than 2 nm whereas the pores in a macroporous material are generally greater than 50 nm.

According to another embodiment, the first and second porous portions 11, 12 are mesoporous.

WO 2011/123135 A1 referred to above as background art teaches that the channels of the porous structure may be very narrow. According to the WO publication, in certain embodiments, an electrolyte is introduced into the channels. Molecules in the electrolyte may be on the order of 2 nanometers (nm). In at least one embodiment, therefore, a smallest dimension of each one of the channels is no less than 2 nm so as to permit the electrolyte to flow freely along the entire length of the channels.

According to an embodiment of the present invention, the diameter of the pores i.e. the smallest dimension of the channels formed by the pores is less than 2 nm.

According to a further embodiment, the first and second porous portions 11, 12 contain pores or channels with widths or diameters mainly between 0.5 and 2 nm.

According to an even further embodiment, the smallest diameters of the pores or channels in the first and second porous portions 11, 12 are less than 2 nm, such as less than 1.5 nm. In some embodiments, the smallest diameters of the pores or channels in the first and second porous portions 11, 12 are even less than 1 nm According to an embodiment, the average smallest dimension of the channels in the first and second porous portions 11, 12 is less than 2 nm, such as less than 1.5. In some embodiments, the average smallest dimension of the channels in the first and second porous portions 11, 12 is less than 1 nm.

These embodiments are contrary to the teaching of WO 2011/123135 A1, which requires that the smallest dimension is no less than 2 nm so as to permit the electrolyte to flow freely along the entire length of the channels. Now it has been surprisingly found that exactly the opposite is possible and can even provide higher capacitance. This finding is in line with what has been observed for carbon supercapacitors as described in the publication J. Chmiola, G. Yushin, Y. Gogotsi, C. Portet, P. Simon, P. L. Taberna: "Anomalous Increase in Carbon Capacitance at Pore Sizes Less Than 1 Nanometer", *Science* 313, 1760 (2006); DOI: 10.1126/science. 1132195.

Figure 8:
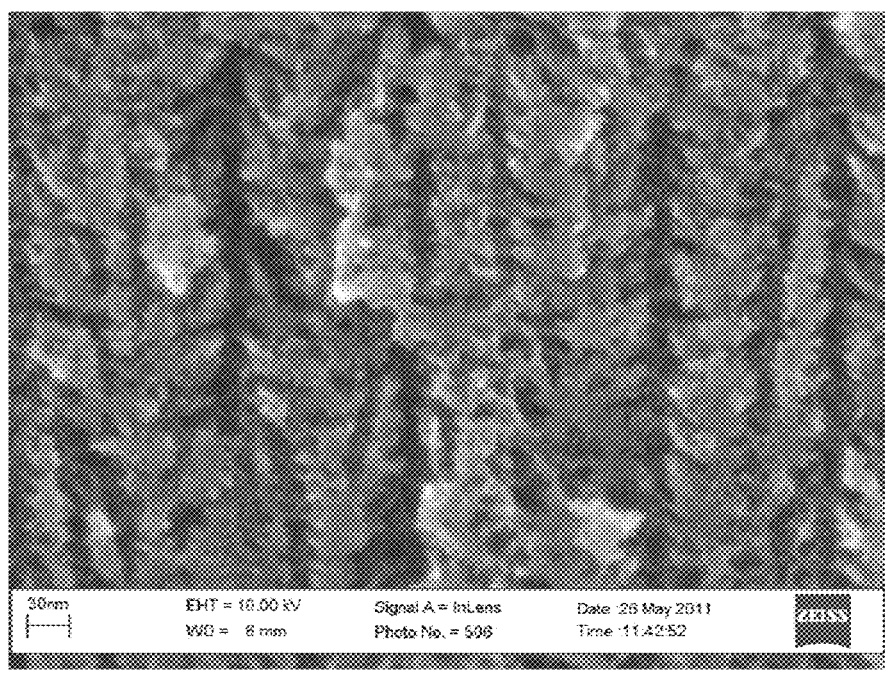
FIG. 8 shows a SEM picture of a mesoporous silicon material prepared according to one of the embodiments.

FIG. 8 shows a SEM picture of a mesoporous silicon material prepared according to one of the embodiments.

According to an embodiment, the first and second porous portions 11, 12 are formed by the semiconductor material 3 and the electrolyte 5 is in direct contact with the said first porous portion 11 and the second porous portion 12, i.e. with the semiconductor material 3 in the pores and around the pores.

According to another embodiment, the first and second porous portions 11, 12 are formed by a native oxide of the semiconductor material 3 and the electrolyte 5 is in direct contact with the said first porous portion 11 and the second porous portion 12, i.e. with the native oxide of the semiconductor material 3. This is common in embodiments using silicon as the semiconductor material 3 because silicon readily forms a native oxide on its surface.

According to a further embodiment, the first electrode 1 is formed in a first piece of the semiconductor material 3 and the second electrode 2 is formed in a second piece of the semiconductor material 3. The first and second pieces can be taken from different semiconductor bodies and located suitable in relation to each other. One of the possible manufacturing methods that can be used here is so called wafer bonding. Alternatively, the first and second pieces can be divided from a single body, for example such that the trench and other necessary recesses are cut through a layer of silicon to form such separate pieces.

According to an embodiment, the first piece of the semiconductor material 3 and the second piece of the semiconductor material 3 are disposed between a first planar dielectric layer and a second planar dielectric layer. These dielectric layers support the first and second pieces such that they do not move relative to each other. These dielectric layers also close the trench from its upper and lower sides.

According to a further embodiment, the first piece of the semiconductor material 3 is formed by a first portion of a silicon-on-insulator layer 8 and the second piece of the semiconductor material 3 is formed by a second portion of the silicon-on-insulator layer 8. Thus, the electrochemical capacitor can be manufactured in the silicon-on-insulator layer 8 on a SOI wafer. This embodiment allows good possibilities for integration with other devices.

According to a further embodiment, an insulator layer 7 supporting the silicon-on-insulator layer 8 delimits a bottom surface of the trench 4 and a second insulator layer 9 on the silicon-on-insulator layer 8 delimits an upper surface of the trench 4 and a further insulator material closes the ends of the trench 4 such that the trench 4 forms a closed cavity filled with the electrolyte 5.

According to a further embodiment, the closed cavity contains only the electrolyte 5. Thus, there are no other substances in any significant amounts. For example, there are no separator films.

According to an embodiment, a method of manufacturing an electrochemical capacitor comprises:
providing a first electrode 1 comprising a first rigid piece having a first porous portion 11;
providing a second electrode 2 comprising a second rigid piece having a second porous portion 12;
attaching the first rigid piece and the second rigid piece to a rigid support structure such that the first rigid piece, the second rigid piece and the rigid support structure form a cavity partially delimited by the first porous portion 11 and the second porous portion 12; and
filling the cavity with an electrolyte 5.

This method can be used to manufacture embodiments of FIGS. 3 and 4, for instance. The first and second rigid pieces can be attached to the rigid support structure, such as the insulator layer 17 in the embodiment of FIGS. 3 and 4, by means of wafer bonding process, for instance. It is also possible that a portion of the insulator layer 17 is prefabricated on the surface of the first substrate 16 and another portion of the insulator layer 17 is prefabricated on the surface of the second substrate 18 and the final insulator layer 17 is formed when these portions are bonded together.

According to another embodiment, the method of manufacturing an electrochemical capacitor comprises:
providing a first portion of a rigid support structure; and
providing a first electrode 1 on the first portion of the rigid support structure, the first electrode 1 comprising a first rigid piece having a first porous portion 11;
providing a second electrode 2 on the first portion of the rigid support structure spaced apart from said first electrode 11, the second electrode 2 comprising a second rigid piece having a second porous portion 12;
providing a second portion of the rigid support structure such that the first rigid piece, the second rigid piece and the rigid support structure form a cavity partially delimited by the first porous portion 11 and the second porous portion 12; and
filling the cavity with an electrolyte 5.

This method can be used to manufacture embodiments of FIGS. 2 and 7, for instance. Then, the insulator layer 7 can act as the first portion of a rigid support structure and the second insulator layer 9 can act as the second portion of a rigid support structure. The first and second rigid pieces can be made of a single silicon-on-insulator layer 8, According to a further embodiment, the manufacturing method of an electrochemical capacitor comprises:
making the trench 4 in the semiconductor material 3;
making pores in the semiconductor material 3 delimiting the trench 4 in order to form the first porous portion 11 at a first side of the trench 4 and the second porous portion 12 at a second side of the trench 4 opposite to the first side; and
filling the trench 4 with the electrolyte 5.

FIGS. 9A-9F show a further embodiment of the manufacturing method.

Figure 9A:
FIGS. 9A-9F show an embodiment of the manufacturing method.

According to FIG. 9A, first a layer of silicon nitride (SiN) is deposited on a SOI wafer. After this step, the product comprises a substrate wafer 21, a buried oxide layer 22 (BOX), a silicon-on-insulator layer 23 (SOI), and the silicon nitride layer 24 (SiN).

Figure 9B:
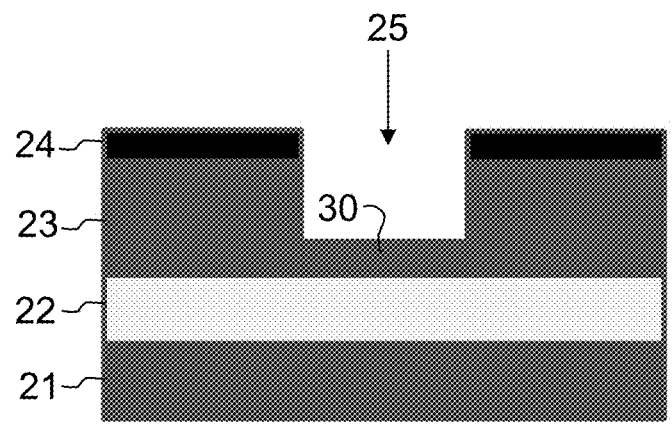

Next, a trench 25 is etched through the SiN 24 and partially through the SOI 23, as shown in FIG. 9B. A thin bottom layer 30 of silicon (of the silicon-on-insulator layer 23) is left on the surface of the oxide layer 22 to form the bottom surface of the trench 25. The thickness of the bottom layer 30 can be between 0.1 and 2 µm, for instance, when the trench 25 is made in the SOI 23 layer. In another embodiment, wherein the trench is made in the handle wafer "below" the buried oxide layer 22, the thickness of the bottom layer 30 can be for example between 5 and 50 µm. Thus, it is also possible to apply the process on the opposite face of the SOI wafer and manufacture the capacitors within the handle wafer.

Figure 9C:
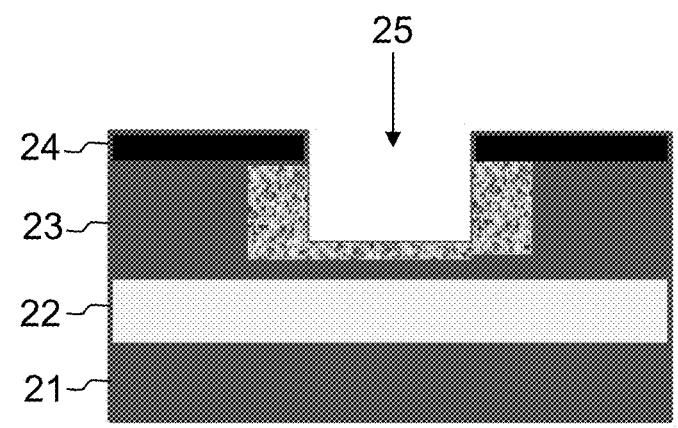

Then, inner surfaces of the trench 25 are made porous by means of a suitable process. The structure after this step is shown in FIG. 9C.

Figure 9D:
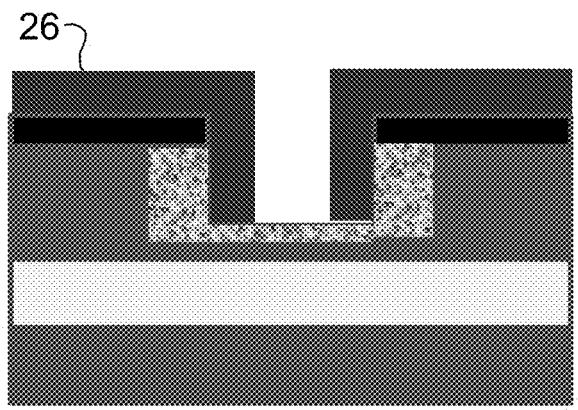

After this, the structure is covered with a photoresist 26, which is patterned as shown in FIG. 9D.

Figure 9E:
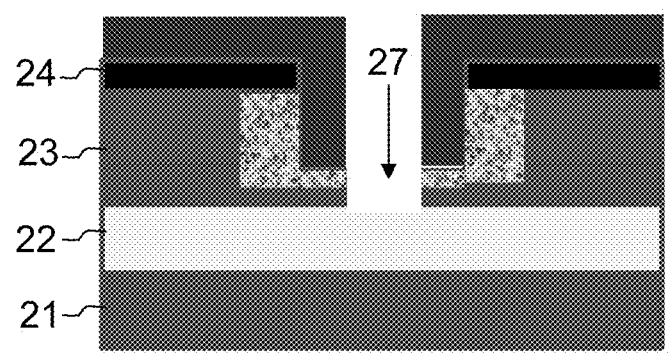

Then, a trench extension 27 is etched through bottom layer 30 to separate the electrodes to be made as separate rigid pieces as shown in FIG. 9E.

Figure 9F:
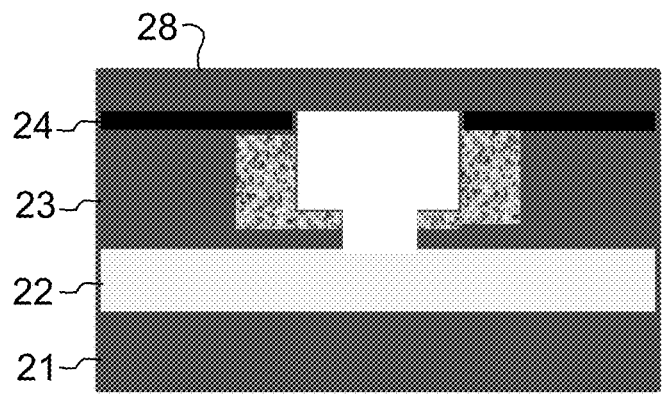

After this, the photoresist 26 is removed and a cover 28 is bonded on top of the structure as shown in FIG. 9F. Thereby a cavity 29 is created inside the structure. However, small holes are left or prepared in the structure so that the electrolyte can be injected into the cavity by using vacuum suction or capillary forces, for instance.

Thus, it is possible to manufacture very small, even nanoscale supercapacitors. Thus supercapacitors are small in volume but have high energy/power content. Some embodiments also provide direct integration with nanoscale harvesters.

One benefit of some of the embodiments is that it is possible to exploit existing MEMS technology and atomic layer deposition, ALD. ALD can be used to deposit the third and fourth materials inside the pores, as referred to above.

One beneficial feature is that voltage range of the capacitor can be tuned by integrating devices in series when they are fabricated on a wafer.

According to embodiments, all the elements can be made by micro/nanoelectronics fabrication processes, which provides high yield and reproducibility.

Structures according to embodiments can also provide small distance between the electrodes without any need for a separator film. Thus, the structure can be made very small in size.

In other words, some embodiments provide fabrication of supercapacitors based on SOI technology. Also the use of an ion permeable separator film can be avoided and the size of the capacitor can be drastically decreased when compared to conventional structures. In the fabrication, we can use the MEMS processes available at MEMS production plants. Such embodiments can provide an integrable and small energy storage device for on-chip applications and energy harvesters.

One benefit is that the current drive capability and total voltage of the supercapacitor can be tuned by geometry of the device.

The devices can be made in cavity-SOI wafers or narrow deep etched trenches with the relevant surfaces covered with porous silicon film. The Si substrates are preferably highly doped for the capacitor application. The highly porous surface can be further covered with conducting films grown, e.g., by ALD. In the device, liquid or solid electrolytes can be used, such as those mention in the above-referred publications.

Porous silicon can be formed using standard method of anodization in HF:ethanol electrolyte. The degree and structure of porosity can be controlled by doping level, electrolyte concentration, light and anodization current.

In one experiment, we found that capacitance with the porous silicon surface can be at least 250-500 times higher that by using a plain silicon surface. The thickness of the porous portion was approximately 3.5 micrometers.

| Sample (PC electrolyte) | Capacitance |
| --- | --- |
| Plain Si | 4 µF |
| Mesoporous Si (not optimised) | 1-2 mF |

Porosity can be further tuned by optimizing silicon doping and etching conditions.

When designing the structure, it is good to pay attention to the resistivity and the surface area of the structure. It is not reasonable to aim at maximum capacitance density but the key benefits for this structure are capability for integration and small size.

The capacitors according to embodiments can be used, for example, together with batteries, electric motor drives, transceivers, as backups from seconds to days, UPS, home appliances and entertainment. They can be used also in combination with photovoltaic cells, e.g. in monitoring, emergency lights etc. . . . . . And of course, MEMS applications and energy harvesting are also very promising application areas for these devices.

The above description is only to exemplify the invention and is not intended to limit the scope of protection offered by the claims. The claims are also intended to cover the equivalents thereof and not to be construed literally.

The invention claimed is:

1. An electrochemical capacitor, comprising;
   a silicon-on-insulator layer,
   a partial trench through the silicon layer of the silicon-on-insulator layer,
   a portion of the silicon layer between the partial trench and the insulating layer of the silicon-on-insulator layer thus defining a bottom surface of the partial trench,
   a trench extension extending from the bottom surface of the partial trench thus exposing the insulating layer, wherein the partial trench and the trench extension separates a first rigid piece of the silicon layer from a second rigid piece of the silicon layer,
   a first electrode comprising the first rigid piece of the silicon layer having a first porous portion,
   a second electrode comprising the second rigid piece of the silicon layer having a second porous portion,
   an electrolyte in contact with the first porous portion and the second porous portion, and
   a cover.

2. The electrochemical capacitor of claim 1, wherein the first rigid piece, the second rigid piece and the cover enclose a cavity for the electrolyte.

3. The electrochemical capacitor of claim 2, wherein the cavity is completely filled with the electrolyte and contains no separator film.

4. The electrochemical capacitor of claim 1, wherein the insulator layer has a planar surface to which both the first rigid piece and the second rigid piece are attached.

5. The electrochemical capacitor of claim 1, wherein pores of the first porous portion and the second porous portion form longitudinal channels in the first rigid piece and the second rigid piece.

6. The electrochemical capacitor of claim 5, wherein each longitudinal channel has a smallest diameter, the smallest diameter being less than 2 nanometers for at least half of the channels.

7. The electrochemical capacitor of claim 6, wherein the smallest diameter is less than 1.5 nanometers for at least half of the channels.

8. The electrochemical capacitor of claim 5, wherein the trench is limited by facing surfaces of the first rigid piece and the second rigid piece; and wherein the longitudinal channels are substantially perpendicular to said facing surfaces.

9. The electrochemical capacitor of claim 5, wherein the longitudinal channels are substantially co-directional with the silicon-on-insulator layer.

10. The electrochemical capacitor of claim 1, wherein the first rigid piece and the second rigid piece are made of a semiconductor material having a resistivity less than 10 Ω-cm.

11. A semiconductor chip, comprising at least one silicon-on-insulator layer and at least one semiconductor device electrically connected to at least one electrochemical capacitor, the at least one electrochemical capacitor having:
   a silicon-on-insulator layer,
   a partial trench through the silicon layer of the silicon-on-insulator layer, a portion of the silicon layer between the partial trench and the insulating layer of the silicon-on-insulator layer thus defining a bottom surface of the partial trench, a trench extension extending from the bottom surface of the partial trench thus exposing the insulating layer, wherein the partial trench and the trench extension separates a first rigid piece of the silicon layer and a second rigid piece of the silicon layer, a first electrode comprising the first rigid piece of the silicon layer having a first porous portion;

a second electrode comprising the second rigid piece of the silicon layer having a second porous portion;

an electrolyte in contact with the first porous portion and the second porous portion, and a cover.

12. The electrochemical capacitor of claim 1, wherein the first rigid piece and the second rigid piece are made of a semiconductor material having a resistivity less than 100 mΩ-cm.

13. The electrochemical capacitor of claim 1, wherein the first rigid piece and the second rigid piece are made of a semiconductor material having a resistivity less than 1 mΩ-cm.

14. The semiconductor chip of claim 11, wherein the first rigid piece, the second rigid piece and the rigid support structure enclose a cavity for the electrolyte, the cavity being completely filled with the electrolyte and contains no separator film.

15. The semiconductor chip of claim 11, wherein the pores of the first porous portion and the second porous portion form longitudinal channels in the first rigid piece and the second rigid piece.

16. The semiconductor chip of claim 15, wherein each channel has a smallest diameter, the smallest diameter being less than 2 nanometers for at least half of the channels.

17. The semiconductor chip of claim 15, wherein the trench is limited by facing surfaces of the first rigid piece and the second rigid piece; and wherein the longitudinal channels are substantially perpendicular to said facing surfaces.

18. The electrochemical capacitor of claim 1, wherein the first rigid piece and second rigid piece are attached to the insulator layer, said insulator layer being a buried oxide layer.

19. The electrochemical capacitor of claim 1, wherein the first porous portion comprises a plurality of first pores within a silicon material of the silicon-on-insulator layer, each of the first pores having an interior surface, the second porous portion comprises a plurality of second pores within a silicon material of the silicon-on-insulator layer, each of the second pores having an interior surface, and the electrolyte is in contact with the interior surface of at least some of the first pores and at least some of the second pores.

* * * * *